United States Patent
Wada

[11] Patent Number: 5,220,185
[45] Date of Patent: Jun. 15, 1993

[54] CCD SHIFT REGISTER
[75] Inventor: Kazushi Wada, Kanagawa, Japan
[73] Assignee: Sony Corporation, Tokyo, Japan
[21] Appl. No.: 926,328
[22] Filed: Aug. 10, 1992
[30] Foreign Application Priority Data
Aug. 22, 1991 [JP] Japan .................. 3-237217
[51] Int. Cl.$^5$ .................. H01L 29/78; H01L 27/14; H01L 31/00
[52] U.S. Cl. .................. 257/239; 257/220; 257/232; 257/250
[58] Field of Search .................. 357/24, 24 LR, 24 M; 377/62, 63; 358/213.23, 213.26, 213.27, 213.29; 257/220, 222, 239, 225, 250, 232

[56] References Cited
U.S. PATENT DOCUMENTS
4,939,560 7/1990 Narabu et al. .................. 357/24 M FOREIGN PATENT DOCUMENTS
2549273 1/1985 France .
60-10675 1/1985 Japan .................. 357/24
62-188371 8/1987 Japan .................. 357/24
62-291967 12/1987 Japan .................. 357/24

OTHER PUBLICATIONS
Patent Abstracts of Japan, vol. 9, No. 280 (E-356), Nov. 8, 1985 & JP-A-60 123 063 (Toshiba), Jul. 1, 1985.

Primary Examiner—Jerome Jackson
Assistant Examiner—Ngan Van Ngo
Attorney, Agent, or Firm—Hill, Steadman & Simpson

[57] ABSTRACT

A CCD shift register has a final transfer electrode which is formed only by a first polysilicon layer, and an output gate electrode which is formed by a second polysilicon layer. Under the output gate electrode, there is formed a doped region which is formed by a doping step of self alignment, independently of a doped region under the transfer electrodes. Therefore, it is possible to choose the impurity concentration and to adjust the potential level under the output gate electrode freely.

20 Claims, 5 Drawing Sheets

CCD SHIFT REGISTER

BACKGROUND OF THE INVENTION

The present invention relates to a CCD shift register, and more specifically to a two-phase CCD shift register which can be advantageously used as a horizontal shift register of a solid-state image sensor.

FIG. 6 shows one conventional horizontal CCD shift register of an image sensor. This shift register is formed in and on a portion of a semiconductor substrate 11. The CCD shift register has a charge transfer section 15 including a series of transfer electrodes, an output gate section 16, and a charge detecting section including a floating diffusion region 21. Each transfer electrode consists of a first polysilicon gate electrode 13 and a second polysilicon gate electrode 14. Under the transfer electrodes, there is formed a potential adjusting p-type region 61 for lowering the potential level in the whole of the charge transfer section. The substrate further includes an n-type region under the second gate electrode 14 of each transfer electrode. This structure can provide a potential profile as shown in FIG. 7. In this potential profile, it is necessary to make a drive bias of the final transfer stage of the charge transfer section 15 shallower than the "L" level, to transfer signal charges from the transfer section 15 to the floating diffusion region 21. On the other hand, the potential level of the output gate (OG) section 16 need not be made so shallow. It is sufficient to obtain such a level as to ensure a dynamic range of the floating diffusion region 21. Rather, the structure that does not allow free potential adjustment of the output gate section is disadvantageous.

In this conventional CCD shift register, adjustment of an impurity concentration of the output gate section incurs mask misalignment. Therefore, it is difficult to adjust the potential level of the output gate section by adjusting the impurity concentration. It is necessary to adjust an external bias voltage VOG, to adjust the potential of the output gate section.

SUMMARY OF THE INVENTION

It is therefore an object of the present invention to provide a CCD shift register which makes it possible to freely adjust the potential level of the output gate section.

According to the present invention, a CCD shift register comprises a semiconductor substrate, a surface insulating layer formed on a top surface of the semiconductor substrate, a row of regular transfer electrodes and one final transfer electrode which are arrayed on the surface insulating layer, and an output gate electrode which is also formed on the surface insulating layer. Each of the regular transfer electrodes comprises a first level electrode portion and a second level electrode portion. The final transfer electrode comprises a first level electrode portion. The output gate electrode comprises a second level electrode portion. The semiconductor substrate further comprises a first impurity region which is formed under the final and regular transfer electrodes, and a second impurity region which is formed under the output gate electrode. The first and second impurity regions are regions of the same conductivity type, and separate from each other.

In this way, the final transfer electrode is formed by the first level electrode, and the output gate electrode is formed by the second level electrode. Therefore, it is possible to form a doped region under the output gate electrode by self-alignment. As a result, it is possible to choose the impurity concentration under the output gate electrode independently, and adjust the potential of the output gate section freely.

DETAILED DESCRIPTION OF THE INVENTION

Figure 1:
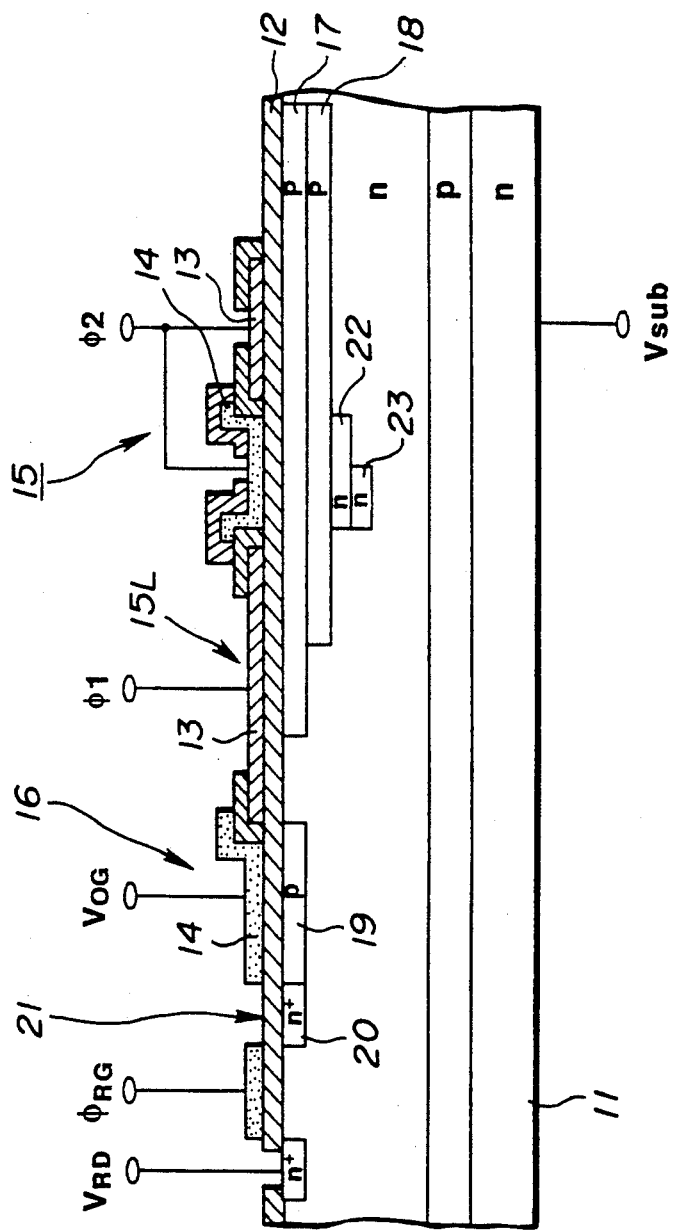
FIG. 1 is a cross sectional view showing a portion of a CCD shift register according to one embodiment of the present invention.
Figure 2A:
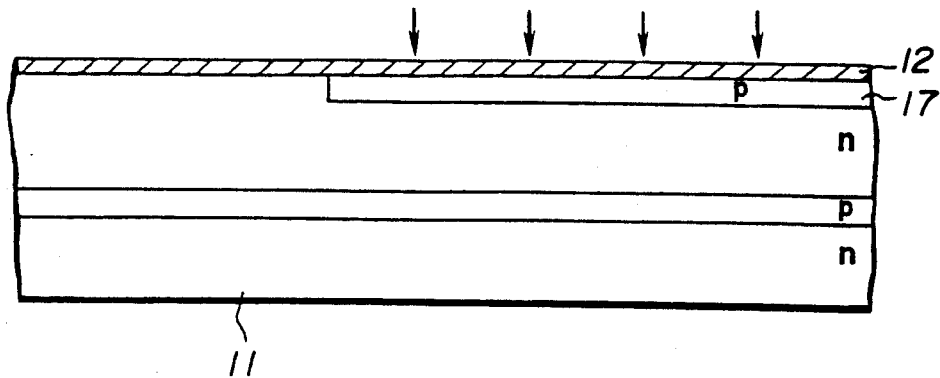
FIGS. 2A-2C and 3A-3C are cross sectional views showing a sequence of steps for fabricating the CCD shift register shown in FIG. 1.
Figure 2B:
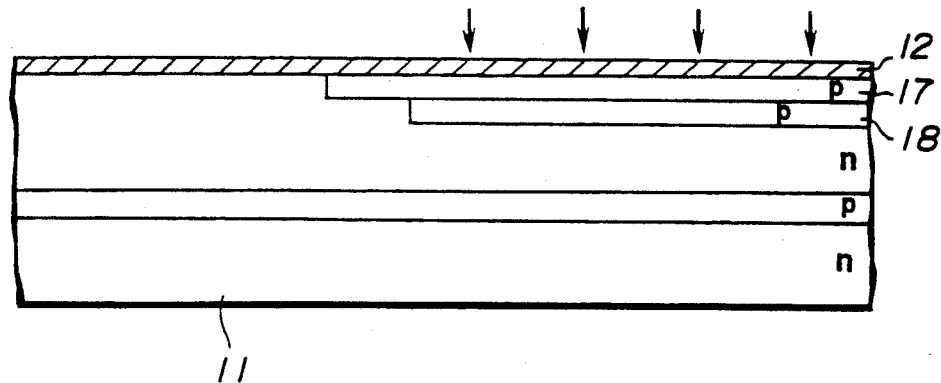
Figure 2C:
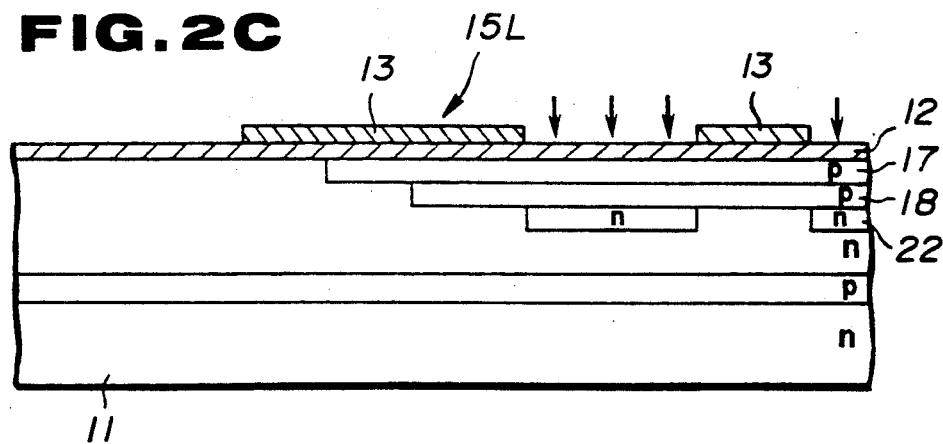

FIG. 1 shows a portion of a CCD shift register according to one embodiment of the present invention.

The CCD shift register shown in FIG. 1 comprises a semiconductor substrate 11, and a multilayer (or multilevel) metallization structure formed on a top surface of the substrate 11.

The substrate 11 of this example is an n-type substrate. The substrate 11 of this example comprises an n-type bulk layer extending in a bottom surface of the substrate, a p-type well region which extends on the bulk layer in FIG. 1, and an n-type top region (or n-type well) extending from the top surface of the substrate 11 into the substrate 11, and having an underside which is in contact with the p-well region. In FIG. 1, the p well region is sandwiched between the n bulk layer and the n top layer.

The multilayer metallization structure comprises a surface insulating layer 12 formed on the top surface of the substrate 11. The multilayer structure further comprises a plurality of regular (non-final) transfer electrode 15 and one final transfer electrode 15L, which are all arrayed in a row on the surface insulating layer 12, for controlling charge motion in the CCD shift register. The row of the regular and final transfer electrodes 15 and 15L constitute a charge transfer section of the CCD shift register. The final transfer electrode 15L constitutes a final transfer stage of the charge transfer section. Each of the regular transfer electrodes 15 is a two-layer electrode consisting of a first level gate electrode (or first level portion) 13 (for serving as a transfer step) and a second level gate electrode (or second level portion) 14 (for serving as a storage step). The final transfer electrode 15L is different in cross sectional configuration, from the regular transfer electrodes 15, as shown in FIG. 1. The final transfer electrode 15L is a one-layer electrode consisting only of a first level gate electrode 13. In this example, all the first and second level gate electrodes 13 and 14 are polisilicon gate electrodes. In each of the regular transfer electrodes 15, the first and second level gate electrodes 13 and 14 are separated from each other by an interlayer insulating film.

The multilayer structure further comprises an output gate electrode 16 that is a one-layer electrode consisting only of a second level polysilicon gate electrode 14. The output gate electrode 16 constitutes an output gate section of the CCD shift register. The final transfer electrode 15L is located between the output gate electrode 16, and the penultimate transfer electrode which is a terminal one of the regular electrodes 15.

The semiconductor substrate 11 further comprises a first potential adjusting impurity region for adjusting potential in the charge transfer section so as to prevent the potential level from becoming too deep. In this example, the first potential adjusting region is a two-layer region of the p-type, and consists of an upper subregion 17 and a lower subregion 18, which both extend under the regular and final transfer electrodes 15 and 15L in a charge transfer direction in which signal charges are transferred. The upper subregion 17 extends in the top surface of the substrate 11. The lower subregion 18 is formed under the upper subregion 17. The lower subregion 18 is bounded, on the upper side, by the upper region 17. The length of the upper subregion 17 measured along the charge transfer direction is greater than that of the lower subregion 18. The lower subregion 18 has one end under the final transfer electrode 15L. The upper subregion 17 extends beyond this end of the lower subregion 18 toward the output gate section, and terminates at one end which is still under the final transfer electrode 15L. In this way, a step is formed at one end of the first potential adjusting region in order to increase transfer electric field under the final transfer electrode 15L.

The semiconductor substrate 11 further comprises a second impurity region 19 formed under the output gate electrode 16. In this example, the second impurity region 19 is a p-type region extending from the top surface of the substrate 11 into the n-type top region. The second impurity region 19 is separated from the first impurity region (17 and 18) by the top n region.

The substrate 11 shown in FIG. 1 further comprises a floating diffusion (FD) region 20 which adjoins the second impurity region 19. The floating diffusion region 20 is a highly doped n+-type region which extends from the top surface of the substrate 11 into the n-type top region. In this substrate 11, there is further formed an underlying region under the second level gate electrode 14 (the storage step) of each regular transfer electrode. Each underlying region is a two-layer region formed under the lower subregion 18 of the first potential adjusting region, and consists of an upper subregion 22 and a lower subregion 23. In this example, both of the upper and lower subregions 22 and 23 are of the n-type. The upper n subregion 22 is bounded, on the upper side, by the lower p subregion 18, and the lower n subregion 23 is bounded, on the upper side, by the upper n subregion 23. The length of the upper n subregion 22 is greater than that of the lower n subregion 23, and there is formed a step only on one side of the underlying region, as shown in FIG. 1. The upper n subregion 22 is formed under both of first and second halves of the second level electrode 14 of each transfer electrode 15. The lower n subregion 23 is formed only under the second half of the second level electrode 14. In each regular transfer electrode 15, the first half of the second level electrode 14 is closer to the first level electrode 13 than the second half, and the first half is located between the first level electrode 13, and the second half of the second level electrode 14.

Figure 4:
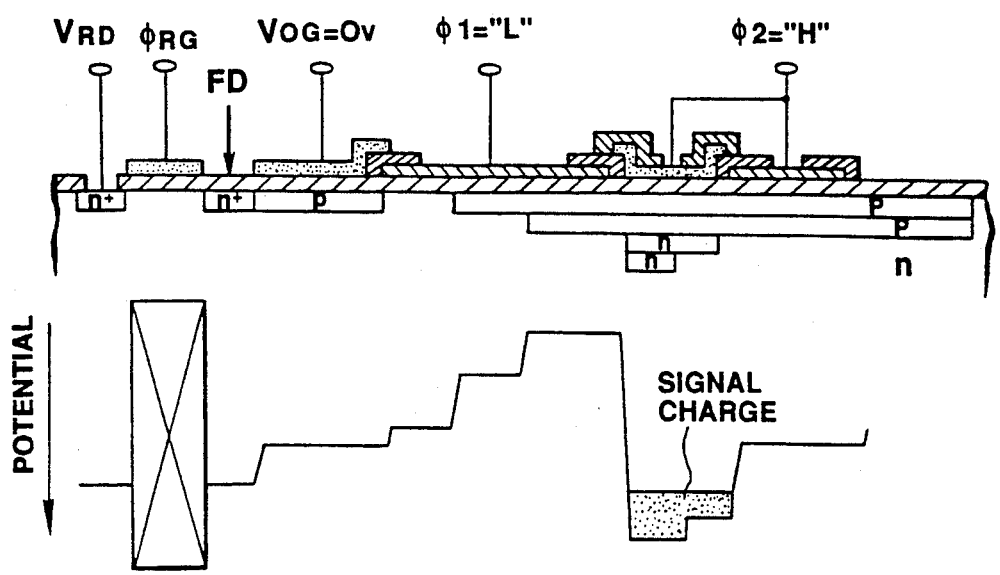
FIG. 4 is a view showing a potential profile in the CCD shift register shown in FIG. 1.

The CCD shift register shown in FIG. 1 further comprises, at least, first and second clock input terminals for receiving two-phase clocks $\phi 1$ an $\phi 2$, and an output gate terminal ($V_{OG}$). The transfer electrodes 15 and 15L are connected alternately with one of the first and second clock input terminals. The output gate electrode 16 is connected with the output gate terminal. In FIG. 4, the output gate electrode is held at a ground potential.

FIGS. 2A~3C show a process for fabricating the CCD shift register shown in FIG. 1.

The semiconductor substrate 11 having an npn structure is prepared by introducing donors and acceptors into the starting material by ion implantation. At a step FIG. 2A, the upper subregion 17 is formed by implanting ions of a p-type impurity (boron, for example) into the n-type top region of the semiconductor substrate 12 from the top surface. Then, at a step shown in FIG. 2B, the lower subregion 18 is formed by ion implantation. Thus, the first impurity region having a step at one end is formed by two ion implantation steps.

Then, the first level polysilicon gate electrodes 13 for the regular transfer electrodes 15 and the output gate electrode 16 are formed by patterning a first layer of polysilicon. The patterned first polisilicon layer has a plurality of regular portions 13 each becoming the first level polysilicon gate of each regular transfer gate 15, and a posterior portion 13 becoming the first level polysilicon gate electrode of the final transfer electrode 15L. Then, the upper subregions 22 are formed by ion implantation with an n-type impurity (phosphorus, for example) by using the first polysilicon gate electrodes 13 as a mask.

Figure 3A:
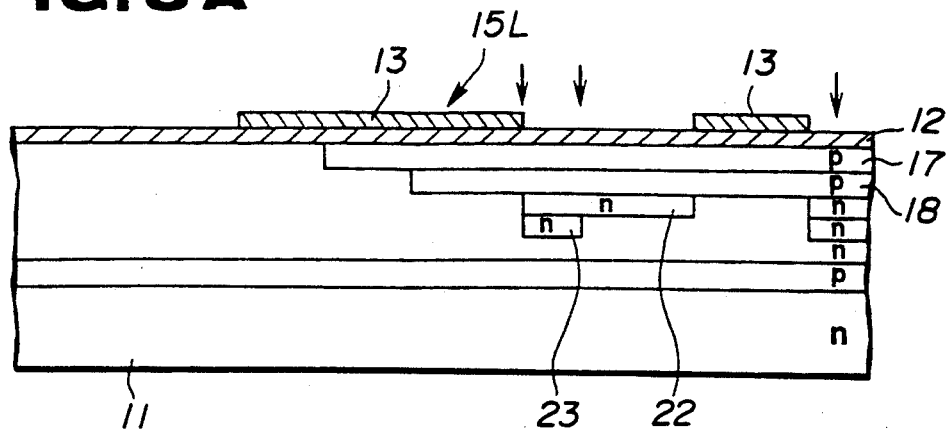

The fabrication process further includes a next step of ion implantation with the n-type impurity to form the lower subregions 23, as shown in FIG. 3A. Thus, the n-type underlying regions having the stepped two-layer structure are formed in the n-top region under the lower p-type subregion 18.

Figure 3B:
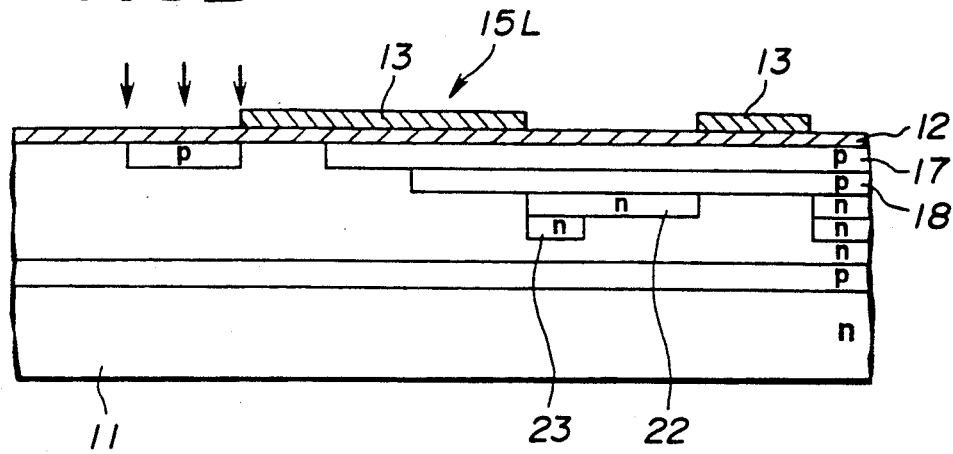
Figure 3C:
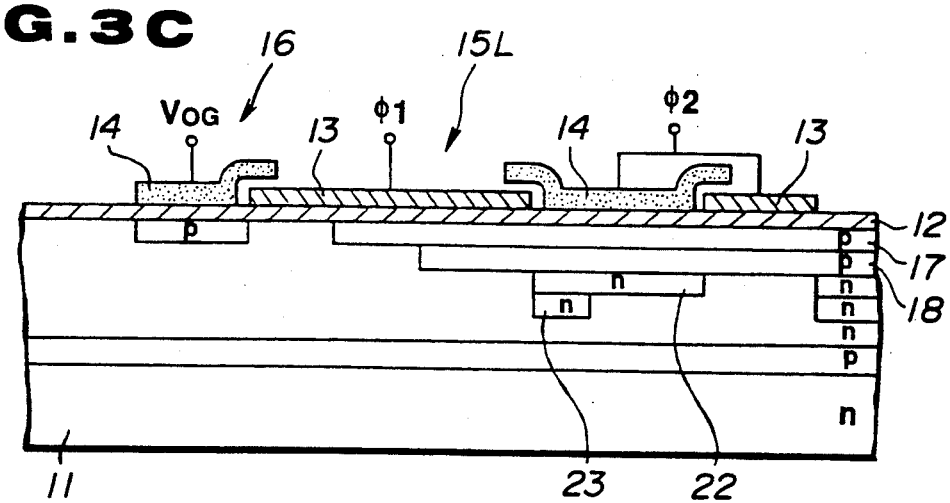

At a next step shown in FIG. 3B, the second impurity region 19 is formed by ion implantation of the p-type impurity. The second impurity region 19 is self-aligned to the polysilicon gate electrode 13 of the final transfer electrode 15L. At a step shown in FIG. 3C, the second level polysilicon gate electrodes 14 of the regular transfer electrodes 15 and the output gate electrode 16 are formed by patterning of a second polysilicon layer which are formed at a second level above the first level at which the first polysilicon layer is formed.

FIG. 4 shows a potential profile in the thus-fabricated CCD shift register.

In this embodiment of the invention, the second impurity region 19 is formed by a technique of self alignment. The second impurity region 19 is self defined by the outline of the polysilicon gate electrode 13. The second impurity region 19 is formed independently of the first impurity region (17, 18). Therefore, it is possible to choose the impurity concentration of the second impurity region 19 independently of the impurity concentrations of the upper and lower subregions 17 and 18 of the first impurity region. That is, this CCD structure makes it possible to adjust the potential of the output gate section without regard to the potential of the charge transfer section.

The n-type underlying regions having the two-layer structure of 22 and 23 create a potential step under the second level polysilicon gate electrode (storage step) 14 of each regular transfer electrode 15, as shown in FIG. 4. Therefore, the CCD shift register can improve the transfer efficiency while preventing decrease in the charge handling capability of the device.

Figure 5:
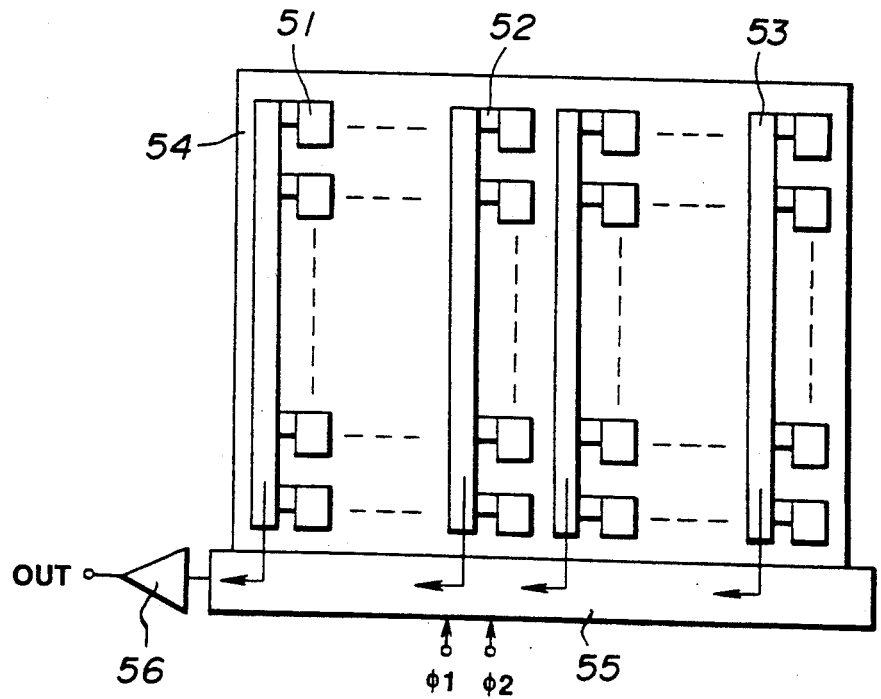
FIG. 5 is a view showing an interline CCD image sensor having a horizontal CCD shift register according to the embodiment of the invention.
Figure 6:
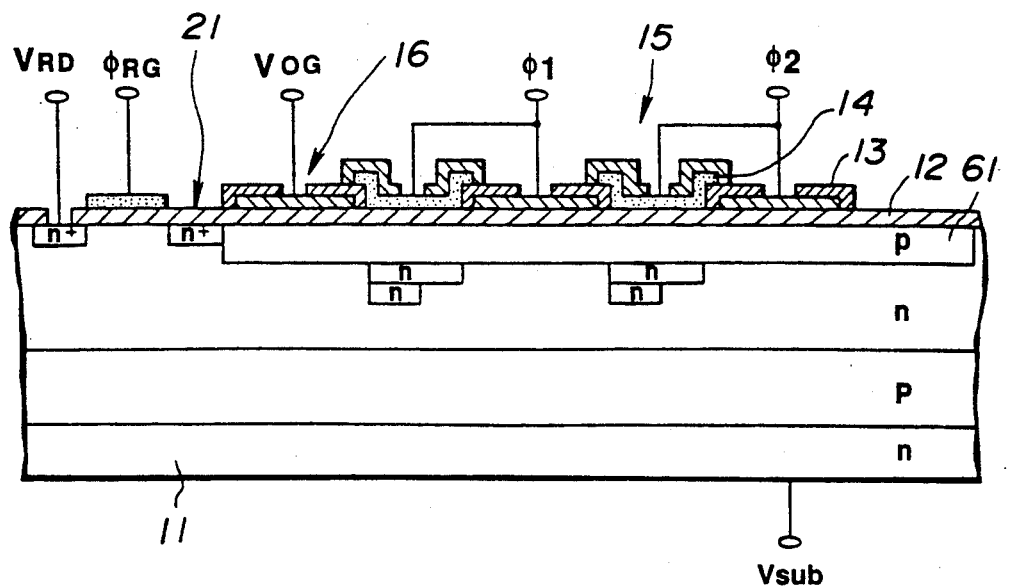
FIGS. 6 and 7 are sectional views showing one conventional CCD shift register and its potential profile.
Figure 7:
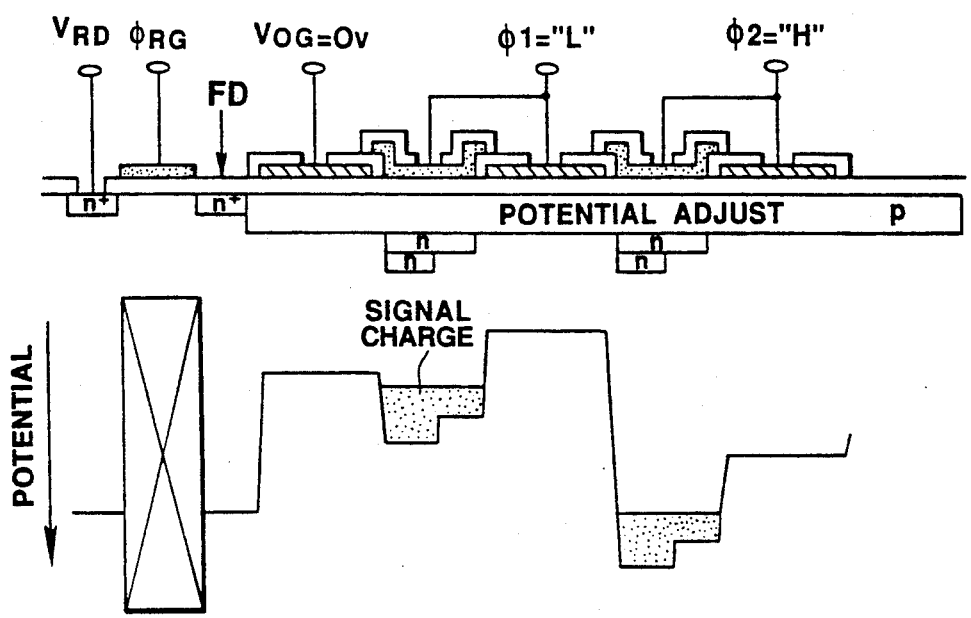

FIG. 5 shows a CCD solid-state image sensor which employs the CCD shift register shown in FIG. 1, as a horizontal shift register 55. The image sensor of this example is an interline CCD image sensor. As shown in FIG. 5, the image sensor has an imaging section (or first section) comprising a two-dimensional array of photosensors (image elements) 51, readout gates 52 and vertical shift registers 53. Signal charge generated and accumulated by each photosensor is read out through the corresponding readout gate 52 to the adjoining vertical CCD shift register 54. The vertical shift registers 54 transfer signal charges in a vertical direction to the horizontal CCD shift register 55, which transfer the signal charges in a horizontal direction to a charge detecting section 56 having a configuration of a floating diffusion amplifier. The charge detecting section 56 receives the signal charges from the horizontal shift register 55, and produces voltage signals in response to the signal charges.

What is claimed is:

1. A CCD shift register comprising:
   a semiconductor substrate comprising a top region of a first conductivity type extending in a top surface of said substrate;
   a surface insulating layer formed on said top surface of said substrate;
   a row of regular transfer electrodes and a final transfer electrode which are arrayed on said surface insulating layer, for controlling transfer of charges, each of said regular transfer electrodes comprising a first level portion and a second level portion, and said final transfer electrode comprising a first level portion; and
   an output gate electrode which is formed on said surface insulating layer and which comprises a second level portion;
   wherein said semiconductor substrate further comprises a first impurity region of a second conductivity type formed in said substrate under said final transfer electrode and said regular transfer electrodes; and
   a second impurity region of the second conductivity type which is formed in said substrate under said output gate electrode and which is separated from said first impurity region.

2. A CCD shift register according to claim 1 wherein each of said first and second level portions of said regular transfer electrodes is made of polysilicon.

3. A CCD shift register according to claim 1 wherein each of said first level portion of said final transfer electrode and said second level portion of said output gate electrode is made of polysilicon.

4. A CCD shift register according to claim 1 wherein said semiconductor substrate further comprises a floating diffusion region adjoining said second impurity region.

5. A CCD shift register according to claim 1 wherein said semiconductor substrate further comprises an n-type bottom layer, and a p-type well region extending on said bottom layer, said top region being an n-type region formed in said p-type well region, said first and second impurity regions being formed in said top region and separated by said top region.

6. A CCD shift register according to claim 1 wherein said output gate electrode is connected with a ground terminal for holding said output gate electrode at a ground potential, and each of said regular and final transfer electrodes is connected with one of first and second two-phase clock input terminals for receiving two-phase clock signals.

7. A CCD shift register according to claim 1 wherein said first level portion and said second level portion of each of said regular transfer electrodes are separated by an interlayer insulating film, and said final transfer electrode consists only of said first level portion, and wherein said final transfer electrode is located between said output gate electrode and a terminal of said regular transfer electrode.

8. A CCD shift register according to claim 7 wherein said second level portion of each of said regular transfer electrodes comprises an upper portion formed above said first level portion.

9. A CCD shift register according to claim 8 wherein said second level portion of said output gate electrode comprises an upper portion formed above said first level portion of said final transfer electrode.

10. A CCD shift register according to claim 7 wherein said first level portions of said regular transfer electrodes, and said final transfer electrode are all formed by a first step of depositing a first polysilicon layer on said surface insulating layer and patterning said first polysilicon layer, and said second level portions of said regular transfer electrodes and said output gate electrode are formed by a second step of depositing a second polysilicon layer and patterning said second polysilicon layer.

11. A CCD shift register according to claim 10 wherein said second impurity region is formed by a doping step which is performed between said first and second steps.

12. A two-phase CCD shift register comprising:
    a top region of a first conductivity type extending into a semiconductor substrate from a top surface of said substrate, a first impurity region for potential adjustment, and a second impurity region, both of said first and second impurity regions being of a second conductivity type, said first and second impurity regions being formed in said top region, and separated from each other by said top region; and separated from each other by said top region; and
    a multilayer electrode structure located on said top surface of said substrate, said structure comprising a surface insulating layer located on said top surface of said substrate, a first level conductive layer located on said surface insulating layer, an interlayer insulating layer located on said first level conductive layer, and a second level conductive layer located on said interlayer insulating layer, said first level conductive layer comprising a plurality of regular electrode portions and one posterior portion, and said second level conductive layer comprising a plurality of regular electrode portions and one posterior portion, said regular electrode portions of said first and second level conductive layers being arranged alternately to form a row of regular transfer electrodes of said two-phase shift register, each of said regular transfer electrodes consisting of one of said regular electrode portions of said first level conductive layer and one of said regular electrode portions of said second level conductive layer, said posterior portion of said first level conductive layer being located between said posterior portion of said second level conductive layer and the row of said regular transfer electrodes, said posterior portion of said first level conductive layer forming a final transfer electrode of said shift register, and said posterior portion of said second level conductive layer forming an output gate electrode of said shift register, said first impurity region being located under said final transfer electrode and said regular transfer electrodes, and said second impurity region being located under said output gate electrode.

13. A two-phase CCD shift register according to claim 12 wherein said shift register further comprises first and second clock input terminals for receiving two-phase clock signals for driving said two-phase shift register, and an output gate terminal, each of said regular transfer electrodes and said final transfer electrode being connected with one of said first and second clock input terminals, said output gate electrode being connected with said output gate terminal.

14. A two-phase shift register according to claim 13 wherein each of said first and second conductive layers is a patterned polysilicon layer.

15. A solid-state image sensor comprising:
a first section for generating signal charges in response to incident light and transferring the signal charges; and
a horizontal CCD shift register for receiving the signal charges from said first section, and further transferring the signal charges in a horizontal direction, said horizontal shift register comprising a top region of a first conductivity type which is formed in a semiconductor substrate, and a row of regular transfer electrodes and a final transfer electrode which are formed on a surface insulating layer formed on a top surface of said semiconductor substrate, each of said regular transfer electrodes consisting of a first level portion and a second level portion, said final transfer electrode consisting only of a first level portion, said horizontal CCD shift register further comprising a first potential adjusting region of a second conductivity type formed in said top region under said regular transfer electrodes and said final transfer electrode, an output gate electrode formed on said surface insulating layer, and a second potential adjusting region of the second conductivity type which is formed in said top region under said output gate electrode and which is separated from said first potential adjusting region by said top region.

16. A solid-state image sensor according to claim 15 wherein said image sensor further comprises a floating diffusion region which is formed in said top region of said substrate and which adjoins said second region, and said electrodes are all polysilicon electrodes.

17. A solid-state image sensor according to claim 16 wherein said second potential adjusting region has an impurity concentration which is different from that of said first potential adjusting region.

18. A solid-state image sensor according to claim 16 wherein said first potential adjusting region comprises an upper region extending in said top surface of said substrate under said final transfer electrode and said regular transfer electrodes, and a lower region extending under said upper region, said upper region extending beyond said lower region toward said second potential adjusting region.

19. A solid-state image sensor according to claim 18 wherein said horizontal shift register further comprises an underlying region of the first conductivity type which is formed in said top region under each of said second level portion of each of said regular transfer electrode, each of said underlying region being formed under said lower region of said first potential adjusting region.

20. A solid-state image sensor according to claim 18 wherein said first section comprises a two-dimensional array of imaging elements and a plurality of vertical CCD shift registers for transferring signal charges generated by said imaging elements to said horizontal CCD shift register.

* * * * *